United States Patent [19]

Zettler

[11] 4,180,747

[45] Dec. 25, 1979

[54] SWITCHING CIRCUIT FOR ELIMINATING THE EFFECTS OF CONTACT BOUNCE

[75] Inventor: John F. Zettler, Stow, Mass.

[73] Assignee: Xenex Corporation, Birmingham, Mich.

[21] Appl. No.: 814,508

[22] Filed: Jul. 11, 1977

Related U.S. Application Data

[62] Division of Ser. No. 724,059, Sep. 16, 1976, Pat. No. 4,048,886.

[51] Int. Cl.² .................... A03K 17/26; H03K 17/56
[52] U.S. Cl. .............................. 307/247 A; 307/293; 328/87
[58] Field of Search ............... 307/228, 236, 262, 263, 307/268, 293, 294, 247 A; 328/71, 76, 78, 114, 118, 129, 140, 87; 340/365 E

[56] References Cited

U.S. PATENT DOCUMENTS

| | | | |
|---|---|---|---|
| 3,252,045 | 5/1966 | Griffin | 307/228 |
| 3,275,851 | 9/1966 | Bedingfield | 307/263 |
| 3,444,394 | 5/1969 | Colvson | 307/261 |
| 3,943,381 | 3/1976 | Uchidoi | 307/247 A |

Primary Examiner—Stanley D. Miller, Jr.
Assistant Examiner—B. P. Davies
Attorney, Agent, or Firm—Reising, Ethington, Barnard, Perry & Brooks

[57] ABSTRACT

A switching circuit is disclosed for eliminating the effects of contact bounce in a movable contact switch connected between a voltage source and the input of a switching transistor. When the movable contact switch is closed, bouncing of the contacts undesirably produces a momentary voltage pulse which may produce false switching of the switching transistor. To avoid false switching, a coupling circuit is connected between the movable contact switch and the input of the transistor switch and includes a time constant circuit which has a different time constant for a positive going control voltage than for a negative going control voltage. The time constant circuit has longer time constant for a pulse of the polarity of the aforementioned momentary pulse than for the opposite polarity pulse whereby the transistor switch is prevented from responding to the momentary pulse.

3 Claims, 2 Drawing Figures

SWITCHING CIRCUIT FOR ELIMINATING THE EFFECTS OF CONTACT BOUNCE

FIELD OF THE INVENTION

This invention relates to control circuits for machines, more particularly, it relates to switching circuits for suppressing undesired transients. This is a division of application Ser. No. 724,059 filed Sept. 16, 1976, now U.S. Pat. No. 4,048,886 which is hereby incorporated by reference.

BACKGROUND OF THE INVENTION

In certain machine control circuits and the like, a transistor switch is turned on or off by a control voltage applied through a movable contact switch. Movable contact switches are susceptible to contact bounce when the contacts are closed and a momentary or transient pulse is produced by the bouncing engagement of the contacts before the contacts reach a stable, closed state to produce the steady state control voltage for the switching transistor. The contact bounce pulse, even though of very short duration, may be effective to switch the transistor and thus produce an undesired or false transistor output signal. In the system of the above-referenced patent, the transistor ouput signal is a logic signal used in self-checking and a false signal has the effect of indicating a fault in the system which results in shut-down of the machine. It is desired to provide means for eliminating this false signaling.

BRIEF SUMMARY OF THE INVENTION

In accordance with this invention, the effect of contact bounce is eliminated in applying a control voltage from a movable contact switch to a device such as a transistor switch. This is accomplished by connecting the input of the transistor switch to the movable contact switch through a coupling circuit which includes a time constant circuit which has a different time constant for a positive going control voltage than for a negative going control voltage. The time constant is longer for a pulse of the polarity of the momentary pulse produced by contact bounce whereby the transistor switch is prevented from responding to the momentary pulse.

BRIEF DESCRIPTION OF THE DRAWINGS

A more complete understanding of the invention may be obtained from the description that follows taken with the accompanying drawings in which.

BEST MODE FOR CARRYING OUT THE INVENTION

An illustrative embodiment of the invention will now be described with reference to the drawings.

Figure 1:
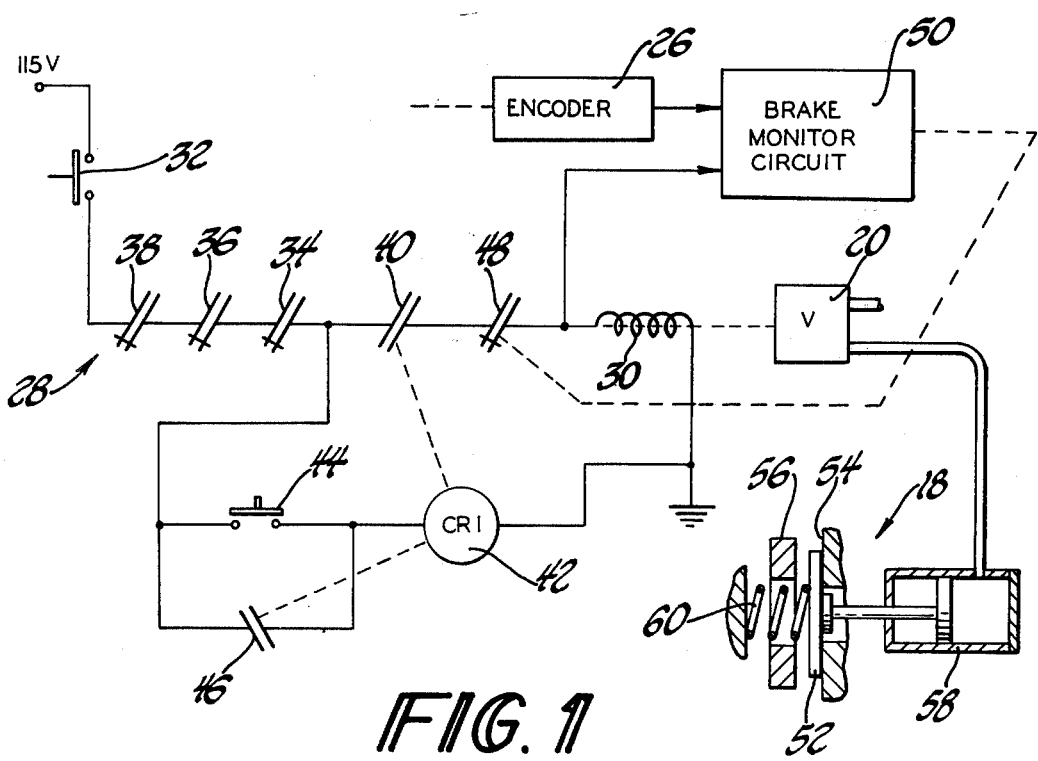
FIG. 1 depicts a machine control circuit.

FIG. 1 is a schematic representation of a typical punch press control circuit with the brake monitor of this invention shown in block diagram. The conventional portion of the control circuit comprises a series circuit 28 connected across a supply voltage source and including the solenoid winding 30 of the solenoid valve 20. The series circuit includes a power on-off switch 32 for energizing the control circuit. It also includes a series of normally closed switch contracts, namely, top-stop contacts 34, die protection contacts 36 and pinch-point intrusion contacts 38. The series control circuit 28 also includes normally open starting switch contacts 40 which are actuated by a control relay 42 which is momentarily energized by a manual start switch 44. A set of holding contacts 46 are also actuated by the control relay 42 and maintains the relay 42 energized after the start switch 44 is released. The series control circuit 28 also includes normally closed, safety interrupt contacts 48 which are controlled by the brake monitor circuit 50 in a manner to be described subsequently. The clutch-brake unit 18, shown in schematic fashion in FIG. 1, is an air pressure clutch and a spring applied brake. It comprises a disc 52 which is drivingly connected with the crankshaft of the press and is also axially shiftable between engagement with the fixed brake member 54 and the driving clutch member 56 which is rotatably driven by the prime mover of the press. An air cylinder 58 actuates the disc 52 to engage the clutch and works in opposition to a brake spring 60 when air pressure is admitted to the cylinder through the solenoid valve 20. When the air pressure is dumped from the cylinder through the valve 20, the clutch is disengaged and the brake is applied by the brake spring 60.

As shown in FIG. 1, the brake monitor circuit 50 obtains two input signals from the press and in response thereto controls the actuation of the safety interrupt contacts 48. One of the input signals is derived from the encoder 26 and represents the motion of the crankshaft of the press. The other of the input signals is derived from the solenoid valve control circuit and signifies initiation of brake application to stop the press or clutch engagement to start the press.

The purpose of the clutch-brake signal circuit is to signal the logic circuitry when the clutch is engaged and when the brake is applied. It is noted in the clutch-brake arrangement mentioned above, the deenergization of the air valve solenoid initiates the disengagement of the clutch and the initiation of the brake application. Although there is a small time delay between clutch disengagement and brake application, the energization of the air valve solenoid is a suitable signal to indicate clutch engagement and the deenergization of the solenoid is a suitable signal to indicate brake application.

Figure 2:
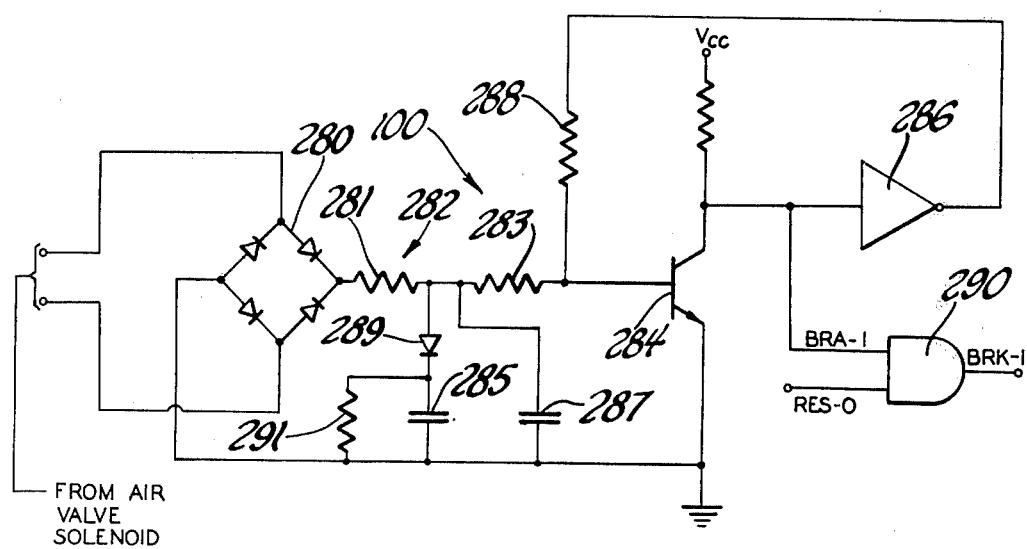
FIG. 2 is a schematic diagram of the invention.

The clutch-brake signal circuit is shown in FIG. 2. The input signal is derived from the terminals of the air valve solenoid and this signal is applied across the input terminals of a full wave rectifier 280. The output of the rectifier 280 is applied through a differential time constant circuit 282 to the input of a transistor 284. The time constant circuit will be described below. The output of the transistor is applied through an inverter 286 and a resistor 288 in a positive feedback loop to the input. The output of the transistor is also applied to one input of an AND gate 290. The other input of the AND gate 290 receives a rest signal RES-0 from a reset circuit which will be described below. The AND gate 290 produces clutch-brake signal BRK-1.

It has been found that special provision is required to prevent undesired response to erratic pulses such as those produced by contact bounce of the press starting contacts. An undesired response of the clutch-brake signal circuit to contact bounce causes the clutch-brake signal BRK-1 to go to logical low. This signal is used to cause the initiation of the clutching and running mode of operation of the monitor and self-checking circuits. As discussed above, the monitor circuit depends upon pulses from the encoder to perform its function; if an encoder pulse is not produced within a certain time after the initiation of clutching, the press should be shut down. A self-check circuit will be described below which receives the clutch-brake signal and which allows a certain time depending upon press characteristics, for example 100 milliseconds, for receipt of an encoder pulse. If a momentary clutch-brake signal is produced, as by contact bounce, the clutch will not respond fast enough to accelerate the crank. Contact bounce pulses are typically about 10 milliseconds or less duration. There will be no encoder pulse in the allotted time period and the self-check circuit will shut down the press and latch it off. To prevent this, the clutch-brake signal circuit is provided with the differential time constant circuit 282. The circuit couples the output of the rectifier 280 to the input of the transistor 284. It comprises a pair of series resistors 281 and 283 connected between the rectifier and the base of the transistor and a pair of shunt capacitors 285 and 287 connected from the junction of the resistors to ground. A diode 289 is connected in series with the capacitor 285 to allow it to be charged through resistor 281 and to prevent it from being discharged through resistor 283 and the input circuit of the transistor 284. A discharge resistor 291 is connected across the capacitor 285 to ground. It can be seen that capacitors 285 and 287 are effectively in parallel for a positive-going charging voltage at the output of the rectifier, as in the case of a clutching signal. Thus, for clutching, the circuit has relatively large time constant. Capacitor 285 is larger than capacitor 287, suitably by a factor of about 3. Resistors 281 and 283 are suitably equal in value and resistor 291 is much larger, suitably by a factor of about 10. For a negative-going voltage at the output of the rectifier, as in the case of a braking signal, the circuit has a relatively small time constant since capacitor 285 is blocked and only capacitor 287 discharges into the base of the transistor 284. The capacitor 285 discharges through resistor 291 during the off state, i.e. when the press is in a top stop with the rectifier output at zero voltage. The time constant of the circuit for braking, for example, is about 5 milliseconds and for clutching, about 20 milliseconds. The differential time constant causes the transistor to respond slowly to a positive-going voltage and hence pulses due to contact bounce will not cause a false initiation of clutching. On the other hand, the transistor will respond quickly to a negative-going signal, as for braking. This provides the accurate timing required for measurement of braking deceleration. Due to the cyclic operating characteristics of the machine, the capacitor 285 is discharged once per machine cycle in the machine off-state and the circuit is ready for the next cycle.

In summary, when the air valve solenoid is energized, the full wave rectifier 280 produces an output voltage of positive polarity and the transistor 284 is turned on. Accordingly, the collector of the transistor is low. When the clutch solenoid is deenergized the input to the transistor 284 is low and the output is high. The reset signal RES-0 will be high with the press ready to run. Consequently, the AND gate 290 produces a low output signal BRK-1 when the clutch is engaged; when the clutch is disengaged, and hence the brake is applied, the output signal BRK-1 will be high.

The embodiments of the present invention in which an exclusive property or privilege is claimed are defined as follows:

1. In a control circuit, a movable contact switch for applying a control voltage to a signal generating circuit, said switch being adapted for connection with a voltage source whereby the control voltage is alternately positive going and negative going upon actuation of the switch between open and closed positions, said movable contact switch being subject to contact bounce whereby a momentary voltage pulse is produced upon closure of said contacts, said signal generating circuit including a transistor switch having an input for control thereof and having an output for producing an output signal which is in a first or second state according to the voltage applied to the input, coupling means connected between said movable contact switch and the input of the transistor switch and including a time constant circuit having a different value of time constant for a positive going control voltage than for a negative going control voltage, the time constant being greater for a control voltage of the same polarity as said momentary pulse whereby said transistor switch is prevented from responding to said momentary pulse.

2. The invention as defined in claim 1 wherein the time constant circuit includes first and second capacitors connected across said input of the transistor switch, and a diode connected in series with said first capacitor.

3. The invention as defined in claim 2 wherein the time constant circuit includes first and second resistors connected in series with said input, and a third resistor connected across the first capacitor.

* * * * *